United States Patent
Lee et al.

(10) Patent No.: US 10,553,546 B2
(45) Date of Patent: Feb. 4, 2020

(54) SEMICONDUCTOR PACKAGE AND SEMICONDUCTOR MODULE

(71) Applicant: SAMSUNG ELECTRONICS CO., LTD., Suwon-si (KR)

(72) Inventors: Joungphil Lee, Suwon-si (KR); Yeongseok Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/037,226

(22) Filed: Jul. 17, 2018

(65) Prior Publication Data
US 2019/0198450 A1 Jun. 27, 2019

(30) Foreign Application Priority Data
Dec. 22, 2017 (KR) .......................... 10-2017-0177894

(51) Int. Cl.
*H01L 23/552* (2006.01)
*H01L 23/00* (2006.01)
*H01L 23/367* (2006.01)

(52) U.S. Cl.
CPC ............ *H01L 23/552* (2013.01); *H01L 24/73* (2013.01); *H01L 24/97* (2013.01); *H01L 23/3675* (2013.01); *H01L 2224/73204* (2013.01); *H01L 2224/73265* (2013.01); *H01L 2924/3025* (2013.01)

(58) Field of Classification Search
CPC ....... H01L 23/552; H01L 24/97; H01L 24/73; H01L 23/3675; H01L 2224/73204; H01L 2224/73265; H01L 2924/3025
See application file for complete search history.

(56) References Cited

U.S. PATENT DOCUMENTS

| | | | |
|---|---|---|---|
| 7,109,410 B2 | 9/2006 | Arnold et al. | |
| 8,847,184 B2 | 9/2014 | Cheng et al. | |
| 9,543,258 B2* | 1/2017 | Kim ...................... | H01L 21/561 |
| 9,674,991 B2 | 6/2017 | Chen et al. | |
| 9,685,413 B1 | 6/2017 | Prakash et al. | |
| 2004/0231872 A1 | 11/2004 | Arnold et al. | |
| 2013/0207005 A1 | 8/2013 | Cheng et al. | |
| 2015/0118792 A1 | 4/2015 | Kawamori et al. | |
| 2016/0081235 A1* | 3/2016 | Chen ................... | H05K 13/046 361/752 |
| 2016/0148882 A1* | 5/2016 | Kim ...................... | H01L 21/561 257/659 |
| 2017/0179041 A1 | 6/2017 | Dias et al. | |

FOREIGN PATENT DOCUMENTS

| JP | 6237732 B2 | 11/2017 |
|---|---|---|
| KR | 10-2017-0013202 A | 2/2017 |

* cited by examiner

*Primary Examiner* — John P. Dulka
(74) *Attorney, Agent, or Firm* — Sughrue Mion, PLLC

(57) ABSTRACT

Semiconductor packages and modules are provided. The semiconductor package includes a package substrate; a semiconductor chip disposed on the package substrate; a molding layer covering the semiconductor chip and a first region of the package substrate; and a functional layer covering the molding layer and extending onto a second region of the package substrate that surrounds the first region.

19 Claims, 10 Drawing Sheets

SEMICONDUCTOR PACKAGE AND SEMICONDUCTOR MODULE

CROSS-REFERENCE TO RELATED APPLICATION

This application claims priority from Korean Patent Application No. 10-2017-0177894 filed on Dec. 22, 2017 in the Korean Intellectual Property Office, the disclosure of which is incorporated herein by reference in its entirety.

BACKGROUND

Methods and apparatuses consistent with example embodiments relate to a semiconductor package and a semiconductor module, and more particularly, to a semiconductor package and a semiconductor module fabricated by simplified processes.

As the mobile market is expanded, research on electromagnetic waves and heat emitted from electronic devices is being actively conducted. For many kinds of electronic products, electromagnetic wave emission from semiconductor packages may cause problems with other nearby semiconductor packages. The electromagnetic interference (EMI) and heat may result in various malfunctions, operation abnormality, operation failure, etc.

In addition, various types of semiconductor packages have been developed to meet increasing demands for high speed and dense semiconductor packages, but the EMI and heat issues persist.

SUMMARY

One or more example embodiments provide a semiconductor package that can be fabricated by simple processes.

One or more example embodiments also provide a semiconductor module that can be fabricated by simple processes.

According to an aspect of an example embodiment, there is provided a semiconductor package including: a package substrate; a semiconductor chip disposed on the package substrate; a molding layer covering the semiconductor chip and a first region of the package substrate; and a functional layer covering the molding layer and extending onto a second region of the package substrate that surrounds the first region.

According to an aspect of another example embodiment, there is provided a semiconductor module, including: a module substrate; a first semiconductor chip disposed on the module substrate and having a first height; a second semiconductor chip disposed on the module substrate and having a second height different from the first height; and a functional layer covering the first semiconductor chip, the second semiconductor chip and extending onto a top surface of the module substrate between the first semiconductor chip and the second semiconductor chip.

According to an aspect of yet another example embodiment, there is provided a method of manufacturing a semiconductor package, the method of manufacturing including: providing a package substrate, a plurality of semiconductor chips being provided on a first face of the package substrate, and a molding layer covering each of the plurality of semiconductor chips; forming a plurality of grooves in the molding layer and the package substrate to expose a ground layer of the package substrate between each of the plurality of semiconductor chips; providing a conductive adhesion film on the molding layer to cover each of the plurality of grooves, the conductive adhesion film including a functional layer and a cushion layer; performing a press process on the conductive adhesion film; removing the cushion layer; and cutting the package substrate between each of the plurality of semiconductor chips.

DETAILED DESCRIPTION

Hereinafter, example embodiments will be described with reference to the accompanying drawings. Expressions such as "at least one of" when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
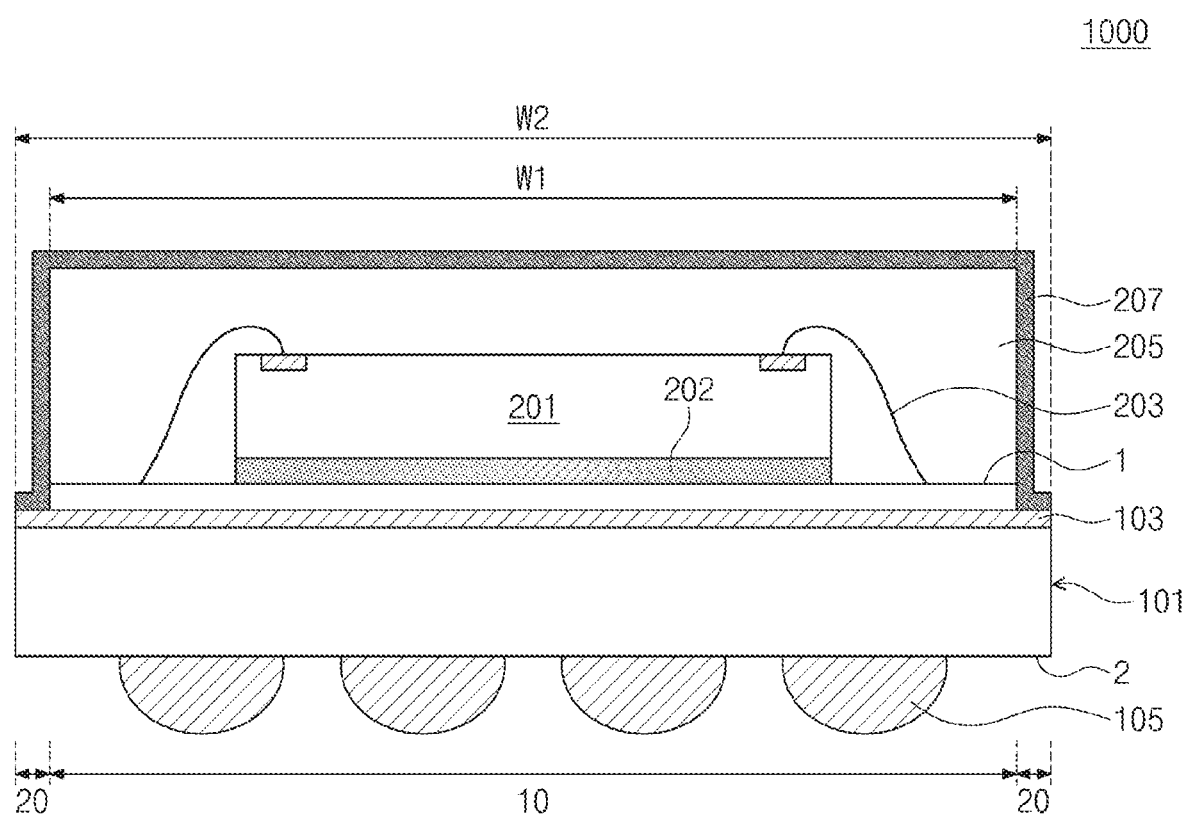
FIG. 1 illustrates a cross-sectional view showing a semiconductor package according to one or more example embodiments.

FIG. 1 illustrates a cross-sectional view showing a semiconductor package according to one or more example embodiments.

Referring to FIG. 1, a semiconductor package 1000 may include a package substrate 101, external terminals 105, a semiconductor chip 201, bonding wires 203, a molding layer 205, and a functional layer 207.

The package substrate 101 may be a printed circuit board (PCB) with a circuit pattern. The package substrate 101 may include a first region 10 and a second region 20. The second region 20 of the package substrate 101 may surround the first region 10 of the package substrate 101. The package substrate 101 may have one face 1 and an opposite face 2. The one face 1 of the package substrate 101 may be a top surface of the package substrate 101, and the opposite face 2 of the package substrate 101 may be a bottom surface of the package substrate 101. The one face 1 of the second region 20 of the package substrate 101 may be located at a level different from that of the one face 1 of the first region 10 of the package substrate 101. For example, the one face 1 of the second region 20 of the package substrate 101 may be located at a level lower than that of the one face 1 of the first region 10 of the package substrate 101.

The package substrate 101 may include a ground layer 103. The ground layer 103 may be disposed in the both first region 10 and the second region 20 of the package substrate 101. For example, the ground layer 103 may be disposed below side surfaces of the first region 10 of the package substrate 101. The side surfaces of the first region 10 of the package substrate 101 may correspond to inner surfaces of the package substrate 101. The ground layer 103 may be exposed at the one face 1 of the second region 20 and side surfaces of the second region 20 of the package substrate 101. The side surfaces of the second region 20 of the package substrate 101 may correspond to outer surfaces of the package substrate 101. The ground layer 103 may include a conductive material. For example, the conductive material may include: a metallic material such as silver (Ag), gold (Au), or copper (Cu); a metal alloy such as copper-silver (Cu—Ag), titanium-silver-copper (Ti—Ag—Cu), or copper-zinc (Cu—Zn); or other electric conductive materials.

The external terminals 105 may be disposed on the opposite face 2 of the package substrate 101. The external terminals 105 may be a solder ball. However, example embodiments are not limited to. For example, the external terminals 105 may be a conductive bump, a conductive spacer, or a pin grid array.

The semiconductor chip 201 may be disposed on the one face 1 of the package substrate 101. The semiconductor chip 201 may be placed on the first region 10 of the package substrate 101. The semiconductor chip 201 may be adhered through an adhesive layer 202 onto the one face 1 of the package substrate 101. The semiconductor chip 201 may be, for example, a semiconductor logic chip or a semiconductor memory chip.

The semiconductor chip 201 and the package substrate 101 may be electrically connected to each other through the bonding wires 203 disposed therebetween. The bonding wires 203 may include, for example, one or more of gold (Au), silver (Ag), platinum (Pt), aluminum (Al), copper (Cu), palladium (Pd), nickel (Ni), cobalt (Co), chromium (Cr), and titanium (Ti). Although not shown, the semiconductor chip 201 may be mounted on the package substrate 101 in a flip-chip bonding manner or other possible manners.

The molding layer 205 may be disposed on the first region 10 of the package substrate 101. The molding layer 205 may cover the one face 1 of the first region 10 of the package substrate 101. The molding layer 205 may not cover the ground layer 103 exposed at the one face 1 of the second region 20 of the package substrate 101. The molding layer 205 may have side surfaces aligned with the side surfaces of the first region 10 of the package substrate 101. The molding layer 205 may have a width W1 less than a width W2 of the package substrate 101. The molding layer 205 may include, for example, an epoxy molding compound (EMC) or an under-fill material.

The functional layer 207 may cover the molding layer 205, and extend onto the side surfaces of the first region 10 of the package substrate 101 and also onto the one face 1 of the second region 20 of the package substrate 101. The functional layer 207 may be in contact with the ground layer 103 exposed at the one face 1 of the second region 20 of the package substrate 101. The functional layer 207 may have a uniform thickness. For example, the functional layer 207 covering the molding layer 205, the side surfaces of the first region 10 of the package substrate 101, and the one face 1 of the second region 20 of the package substrate 101, may have thicknesses that are substantially the same. The functional layer 207 may not cover the side surfaces of the second region 20 of the package substrate 101. For example, the side surfaces of the second region 20 of the package substrate 101 may be exposed by the functional layer 207. The functional layer 207 may be an electromagnetic shield layer or a thermal radiation layer.

When the functional layer 207 is an electromagnetic shield layer, the functional layer 207 may be electrically connected to the ground layer 103, and provide an electrical path for grounding an electromagnetic wave incident on the functional layer 207. The electromagnetic shield layer may include a conductive material or a polymeric material. The conductive material may include, for example, one or more of copper (Cu), silver (Ag), and platinum (Pt). The polymeric material may include, for example, epoxy or thermoplastic polyurethane (TPU).

When the functional layer 207 is a thermal radiation layer, the thermal radiation layer may include a conductive material or a polymeric material. The conductive material may be a high thermal conductive metal such as copper (Cu) or aluminum (Al), or an alloy thereof. The polymeric material may include, for example, epoxy or thermoplastic polyurethane (TPU).

Figure 2:
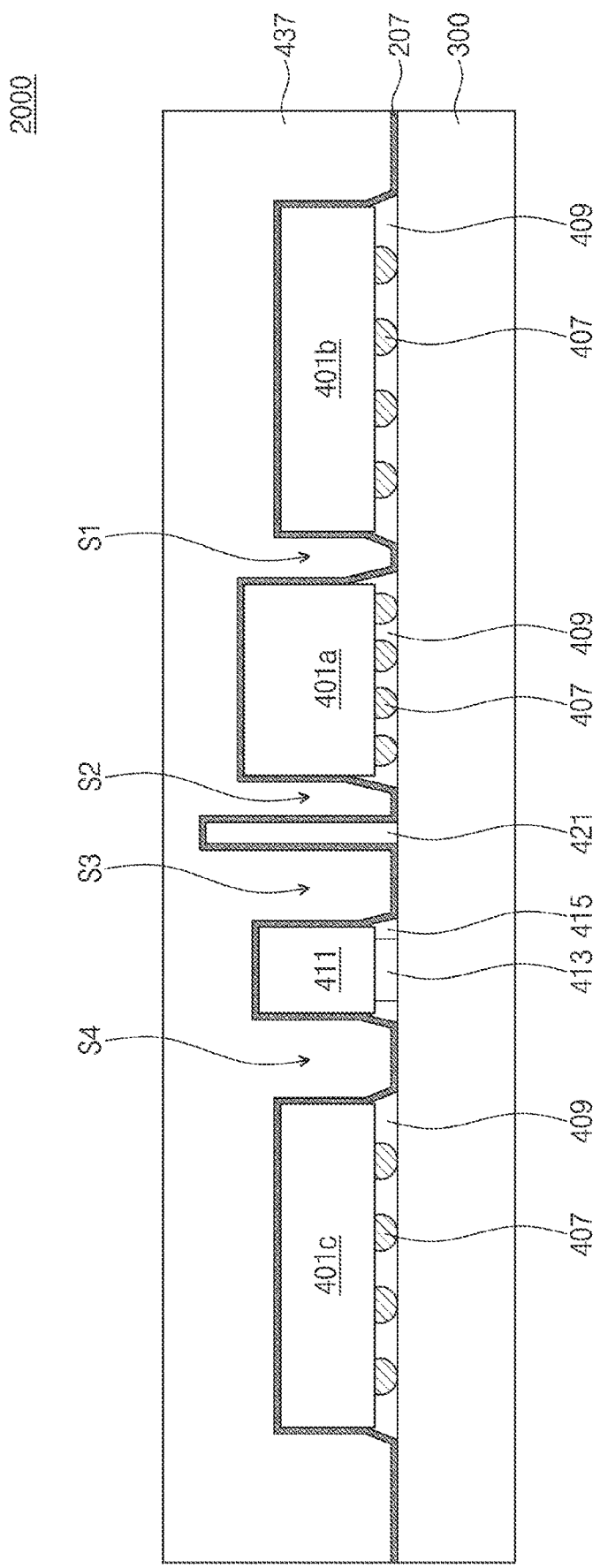
FIG. 2 illustrates a plan view showing a semiconductor module according to one or more example embodiments.

FIG. 2 illustrates a plan view showing a semiconductor module according to one or more example embodiments. For conciseness, constituents substantially the same as those discussed with reference to FIG. 1 are allocated the same reference numerals, and a repetitive explanation thereof will be omitted.

Referring to FIG. 2, a semiconductor module 2000 may include a module substrate 300, a first semiconductor chip 401a, a second semiconductor chip 401b, a third semiconductor chip 401c, a component 411, partition walls 421, a functional layer 207, and a molding layer 437.

The module substrate 300 may be a printed circuit board (PCB) with a circuit pattern. The first, second and third semiconductor chips 401a, 401b and 401c may be disposed on the module substrate 300. The first, second and third semiconductor chips 401a, 401b and 401c may have different heights from each other. Each of the first, second and third semiconductor chips 401a, 401b and 401c may be a semiconductor logic chip or a semiconductor memory chip. A plurality of solder balls 407 may be disposed between the module substrate 300 and each of the first, second and third semiconductor chips 401a, 401b and 401c. The solder balls 407 may electrically connect between the module substrate 300 and each of the first, second and third semiconductor chips 401a, 401b and 401c. A first under-fill resin layer 409 may be disposed within a gap between the module substrate 300 and each of the first, second and third semiconductor chips 401a, 401b and 401c. The first under-fill resin layer 409 may surround surfaces of the solder balls 407. The first under-fill resin layer 409 may include, for example, an under-fill material.

The components 411 may be disposed on the module substrate 300. For example, the component 411 may be disposed between the first semiconductor chip 401a and the third semiconductor chip 401c. The position of the component 411 is not limited to the above, and may be variously changed. The component 411 may be adhered through an adhesive layer 413 onto the module substrate 300. In some example embodiments, the component 411 may be replaced with a resistor, an inductor, a transformer, a passive device, or other electric devices. The component 411 may have a different height from those of the first, second and third semiconductor chips 401a, 401b and 401c. A second under-fill resin layer 415 may be disposed between the component 411 and the module substrate 300, while surrounding the adhesive layer 413. Although only one component 411 is illustrated, example embodiments are not limited thereto. For example, multiple components 411 may be disposed on the module substrate 300. Further, the position of the component 411 may be variously changed.

The partition wall 421 may be disposed on the module substrate 300 between the first semiconductor chip 401a and the component 411. The partition wall 421 may separate the component 411 from other components (not shown). The partition wall 421 may include a conductive material such as aluminum, iron, or copper. Although only one partition wall 421 is illustrated, example embodiments are not limited thereto. For example, the partition wall 421 may be provided in plural. In addition, the position of the partition wall 421 is not limited to the above but may be variously changed.

The functional layer 207 may extend onto a top surface of the module substrate 300, while covering the first, second and third semiconductor chips 401a, 401b and 401c, a plurality of first under-fill resin layers 409, the component 411, the second under-fill resin layer 415, and the partition wall 421. For example, the functional layer 207 may cover top and side surfaces of the first, second and third semiconductor chips 401a, 401b and 401c, surfaces of the plurality of first under-fill resin layers 409, and a surface of the second under-fill resin layer 415. In addition, the functional layer 207 may cover top and side surfaces of the partition wall 421, and also cover top and side surfaces of the component 411.

The functional layer 207 may extend onto a top surface of the module substrate 300 exposed to a first space S1 between the first semiconductor chip 401a and the second semiconductor chip 401b and onto a top surface of the module substrate 300 exposed to a second space S2 between the partition wall 421 and the first semiconductor chip 401a. The functional layer 207 may extend onto a top surface of the module substrate 300 exposed to a third space S3 between the component 411 and the partition wall 421 and onto a top surface of the module substrate 300 exposed to a fourth space S4 between the third semiconductor chip 401c and the component 411.

A thickness of the functional layer 207 covering the top surface of the module substrate 300 may be substantially the same as a thickness of the functional layer 207 covering the first, second and third semiconductor chips 401a, 401b and 401c, the plurality of first under-fill resin layers 409, the component 411, the second under-fill resin layer 415, and the partition wall 421. Each of the first, second, third and fourth spaces S1, S2, S3 and S4 may have an aspect ratio equal to or less than 5. The aspect ratio may correspond to a value obtained when a depth (or height) of each of the first, second, third and fourth spaces S1, S2, S3 and S4 is divided by a width of the each of the first, second, third and fourth spaces S1, S2, S3 and S4.

The molding layer 437 may be disposed on the functional layer 207. The molding layer 437 may cover the functional layer 207 and fill the first, second, third and fourth spaces S1, S2, S3 and S4. The molding layer 437 may include, for example, an epoxy molding compound (EMC) or an under-fill material.

FIGS. 3A, 3B, 3C, 3D and 3E illustrate cross-sectional views showing a method of fabricating a semiconductor package according to one or more example embodiments.

Figure 3A:
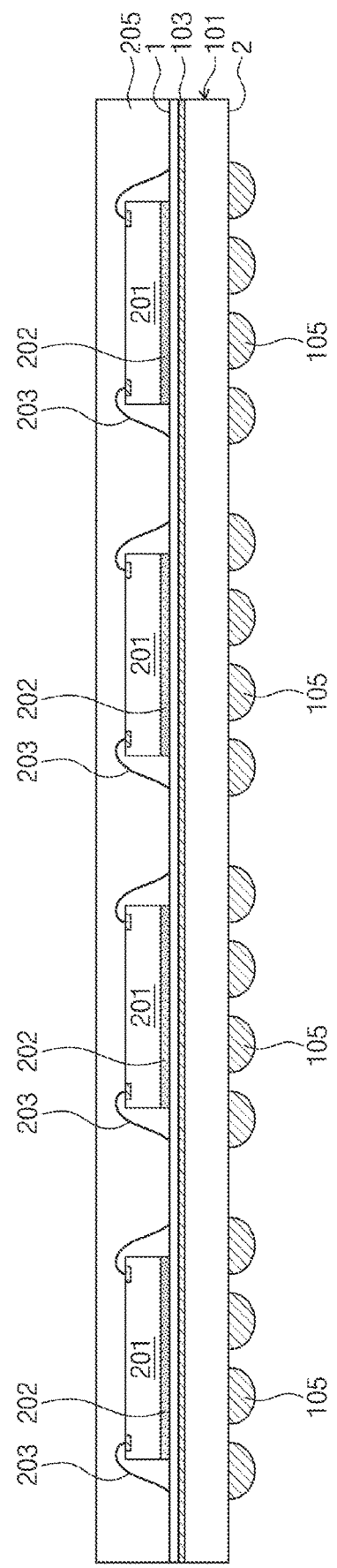
FIGS. 3A, 3B, 3C, 3D and 3E illustrate cross-sectional views showing a method of fabricating a semiconductor package according to one or more example embodiments.

Referring to FIG. 3A, a package substrate 101 may have one face 1 and an opposite face 2 disposed on opposite sides of the package substrate 101. The one face 1 may correspond to a top surface of the package substrate 101, and the opposite face 2 may correspond to a bottom surface of the package substrate 101. The package substrate 101 may be a printed circuit board (PCB) with a circuit pattern. The package substrate 101 may include a ground layer 103. The ground layer 103 may be disposed in the package substrate 101. The ground layer 103 may include a conductive material. For example, the conductive material may include: a metallic material such as silver (Ag), gold (Au), or copper (Cu); a metal alloy such as copper-silver (Cu—Ag), titanium-silver-copper (Ti—Ag—Cu), or copper-zinc (Cu—Zn); or other electric conductive materials.

A plurality of semiconductor chips 201 may be provided on the one face 1 of the package substrate 101, while spaced apart from each other at a regular interval. Each of the semiconductor chips 201 may be adhered through an adhesive layer 202 onto the package substrate 101. The semiconductor chips 201 may be, for example, a semiconductor logic chip or a semiconductor memory chip. A plurality of bonding wires 203 may be disposed between the package substrate 101 and each of the semiconductor chips 201. The bonding wires 203 may electrically connect the semiconductor chips 201 to the package substrate 101. The bonding wires 203 may be formed of, for example, one or more of gold (Au), silver (Ag), platinum (Pt), aluminum (Al), copper (Cu), palladium (Pd), nickel (Ni), cobalt (Co), chromium (Cr), and titanium (Ti).

The molding layer 205 may be formed on the one face 1 of the package substrate 101. The molding layer 205 may cover the semiconductor chips 201. The molding layer 205 may be formed of, for example, an epoxy molding compound (EMC) or an under-fill material. A plurality of external terminals 105 may be formed on the opposite face 2 of the package substrate 101. When the external terminals 105 are solder balls, a soldering process may be performed to form the external terminals 105 on the opposite face 2 of the package substrate 101.

Figure 3B:
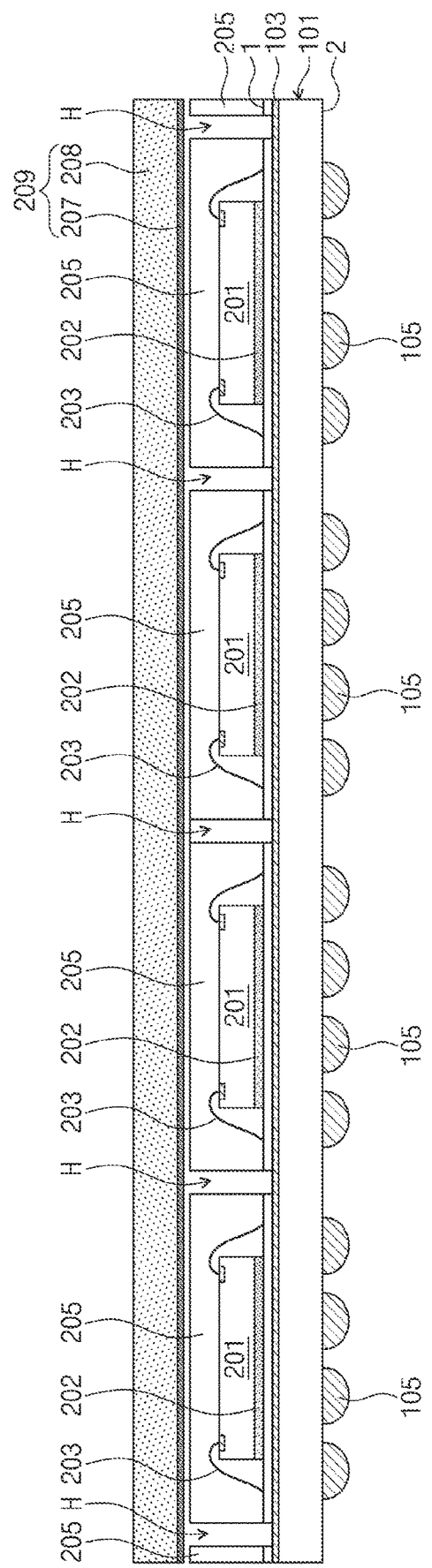

Referring to FIG. 3B, a cutting process may be performed on the molding layer 205 and the package substrate 101. The cutting process may cut the molding layer 205 between the semiconductor chips 201, a portion of the package substrate 101 between the semiconductor chips 201, an edge of the molding layer 205, and a portion of an edge of the package substrate 101 overlapping the edge of the molding layer 205. For example, the cutting process may form a groove H between a pair of neighboring semiconductor chips 201. A pair of neighboring grooves H may define therebetween a region where a unit semiconductor package occupies. The groove H may have a floor surface lower than the one face 1 of the package substrate 101. In some example embodiments, the groove H may have an aspect ratio equal to or less than 5. The aspect ratio may correspond to a value obtained when a depth (or height) of the groove H is divided by a width of the groove H. The cutting process may separate the molding layer 205 into a plurality of pieces. The cutting process may continue until the ground layer 103 is revealed. After the cutting process, the ground layer 103 may be partially exposed to the groove H.

A conductive adhesion film 209 may be disposed on the separated molding layers 205. The conductive adhesion film 209 may include a functional layer 207 and a cushion layer 208. The cushion layer 208 may be stacked on the functional layer 207. The functional layer 207 may be an electromagnetic shield layer or a thermal radiation layer. The functional layer 207 may include a polymer having thermal resistance at a temperature equal to or greater than 200° C. or a complex thereof. When the functional layer 207 is an electromagnetic shield layer, the electromagnetic shield layer may include a conductive material or a polymeric material. The conductive material may include, for example, one or more of copper (Cu), silver (Ag), and platinum (Pt). The polymeric material may include, for example, epoxy or thermoplastic polyurethane (TPU). When the functional layer 207 is a thermal radiation layer, the thermal radiation layer may include a conductive material or a polymeric material. The conductive material may be a high thermal conductive metal such as copper (Cu) or aluminum (Al), or an alloy thereof. The polymeric material may include, for example, epoxy or thermoplastic polyurethane (TPU).

The cushion layer 208 may have a thickness ranging from about 200 μm to about 400 μm. The cushion layer 208 may include a polyethylene-based polymer or a polyurethane-based polymer. The polyethylene-based polymer may be, for example, polymethylpentene (PMP), polyvinylchlodride (PVC), or polybutyleneterephthalate (PBT). The polyurethane-based polymer may be, for example, thermoplastic polyurethane (TPU).

Figure 3C:
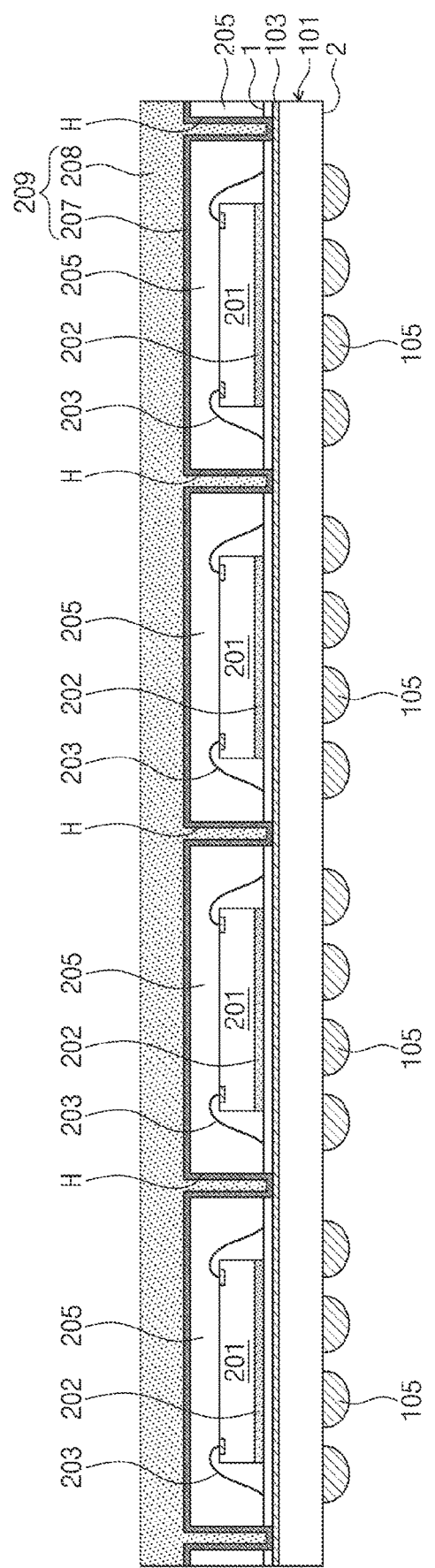

Referring to FIG. 3C, the conductive adhesion film 209 may be processed to cover the molding layers 205 and fill the groove H. For example, the functional layer 207 may conformally cover top and side surfaces of the molding layers 205 and the floor surface of the groove H. The cushion layer 208 may cover the functional layer 207 and fill the groove H. A press process may be performed to cause the conductive adhesion film 209 to cover the surfaces of the molding layers 205 and fill the groove H. The press process may provide the conductive adhesion film 209 with heat and pressure forward against the package substrate 101 for about 5 minutes in a state that the conductive adhesion film 209 is disposed on the molding layers 205. The press process may be performed under a pressure of about 2 megapascal (MPa) to about 10 MPa at a temperature of about 150° C. to about 200° C.

The cushion layer 208 may have elastic modulus decreased due to the heat and pressure such that the groove H may be easily filled with the cushion layer 208. The functional layer 207 may then be conformally formed on the floor surface of the groove H and the side surfaces of the molding layers 205.

Figure 3D:
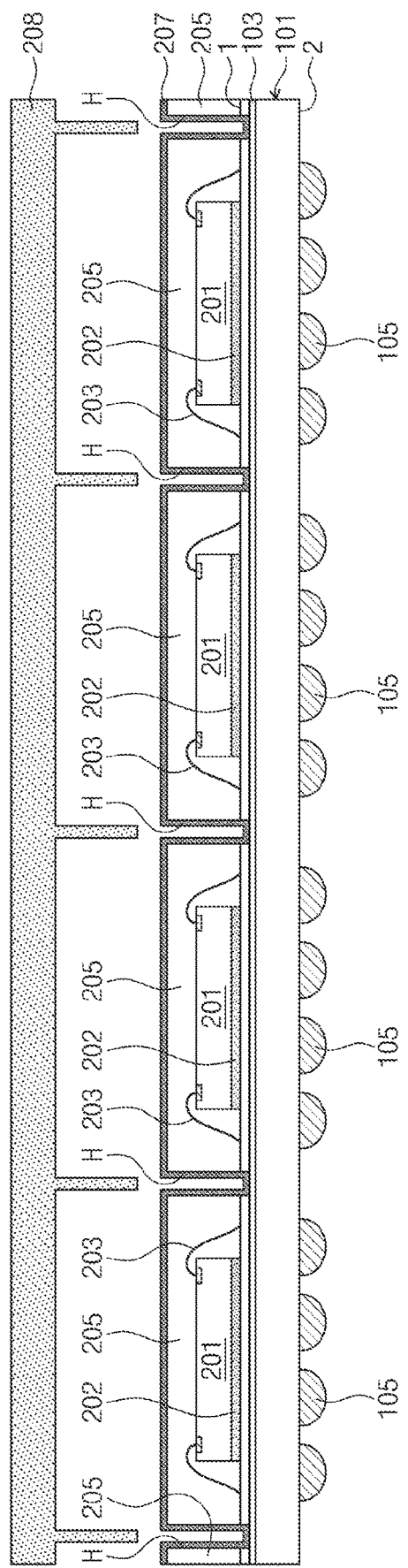

Referring to FIG. 3D, the cushion layer 208 may be removed from the functional layer 207. The press process may expand the cushion layer 208 and reduce the elastic modulus of the cushion layer 208, and therefore an external physical force may easily separate the cushion layer 208 from the functional layer 207. The functional layer 207 may remain on the surfaces of the molding layers 205 and the floor surface of the groove H. After the cushion layer 208 is removed, a curing process may be performed on the functional layer 207. The curing process may cure the functional layer 207. The curing process may be performed at a temperature of about 140° C. to about 180° C.

According to one or more example embodiments, the functional layer 207 may conformally cover the top surfaces of the molding layers 205 encapsulating the semiconductor chips 201 disposed on the package substrate 101, and at the same time, conformally cover the floor surface and sidewalls of the groove H having a high aspect ratio between the molding layers 205. By forming the functional layer 207 prior to a package singulation process, such as a sawing or sorting process, a reduced process time may be realized compared to the case that the formation of the functional layer 207 is performed on each of semiconductor packages after the package singulation process (sawing or sorting).

Figure 3E:
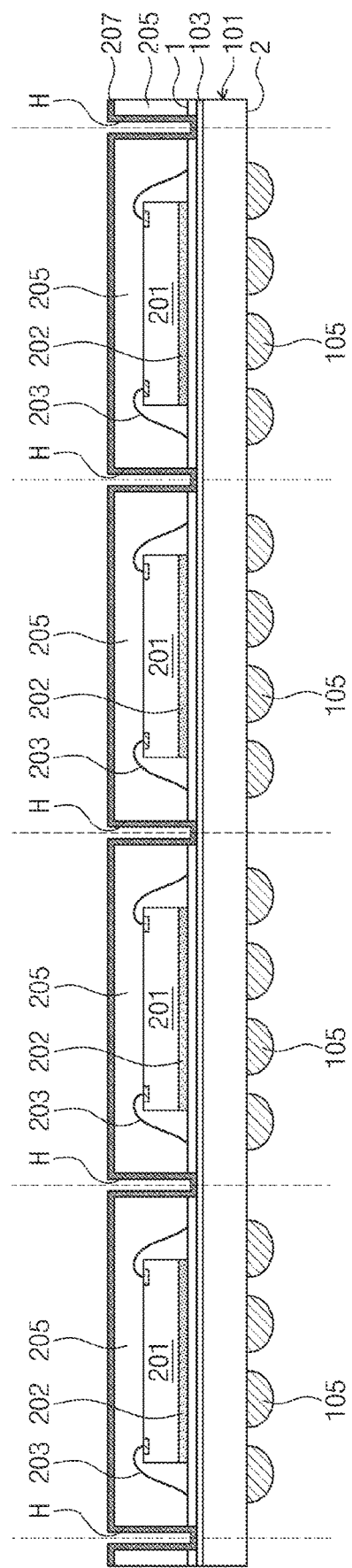

Referring to FIG. 3E, a package singulation process (e.g., sawing or sorting) may be performed within the groove H, thereby forming a plurality of semiconductor packages. If the package substrate 101 has a non-cut portion remaining after the cutting process is performed, the package singulation process (sawing or sorting) may completely cut the non-cut portion of the package substrate 101. In some example embodiments, the package singulation process (sawing or sorting) may cause a scribe lane, along which the package substrate 101 is cut, to have a width less than that of the groove H, which may prevent removal of the functional layer 207 formed on the side surfaces of the molding layers 205.

Figure 4A:
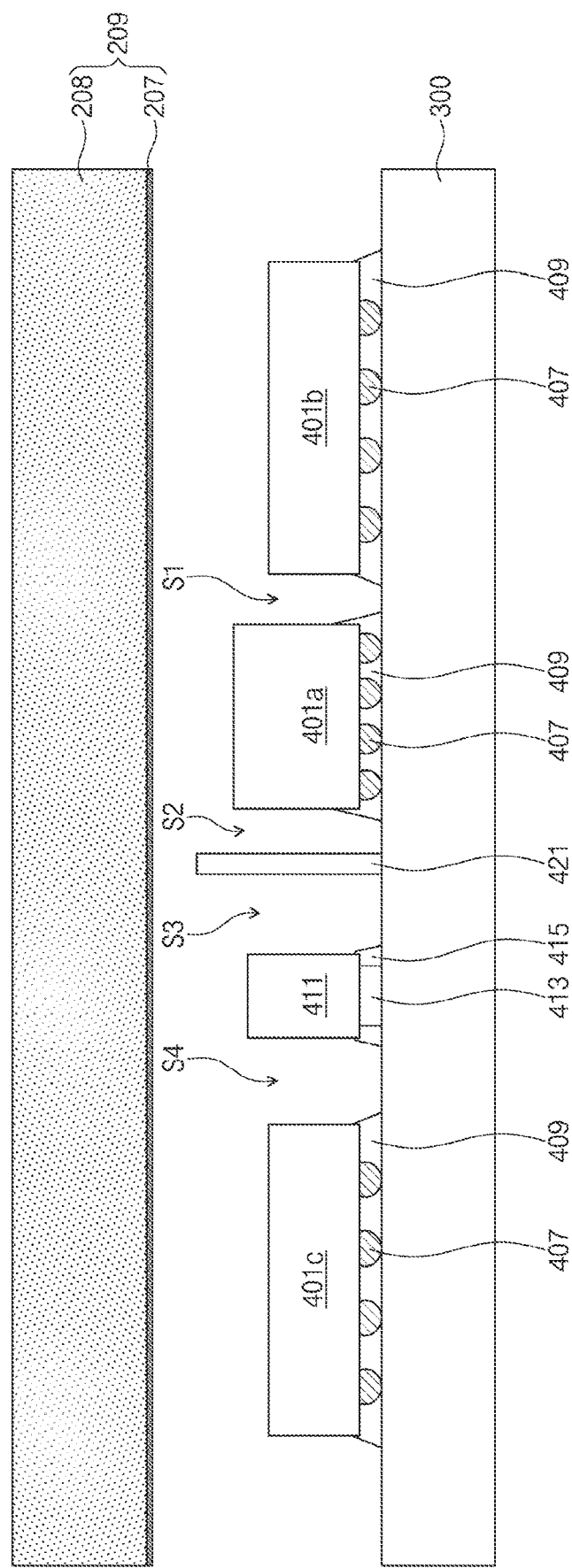
FIGS. 4A, 4B and 4C illustrate cross-sectional views showing a method of fabricating a semiconductor module according to one or more example embodiments.
Figure 4B:
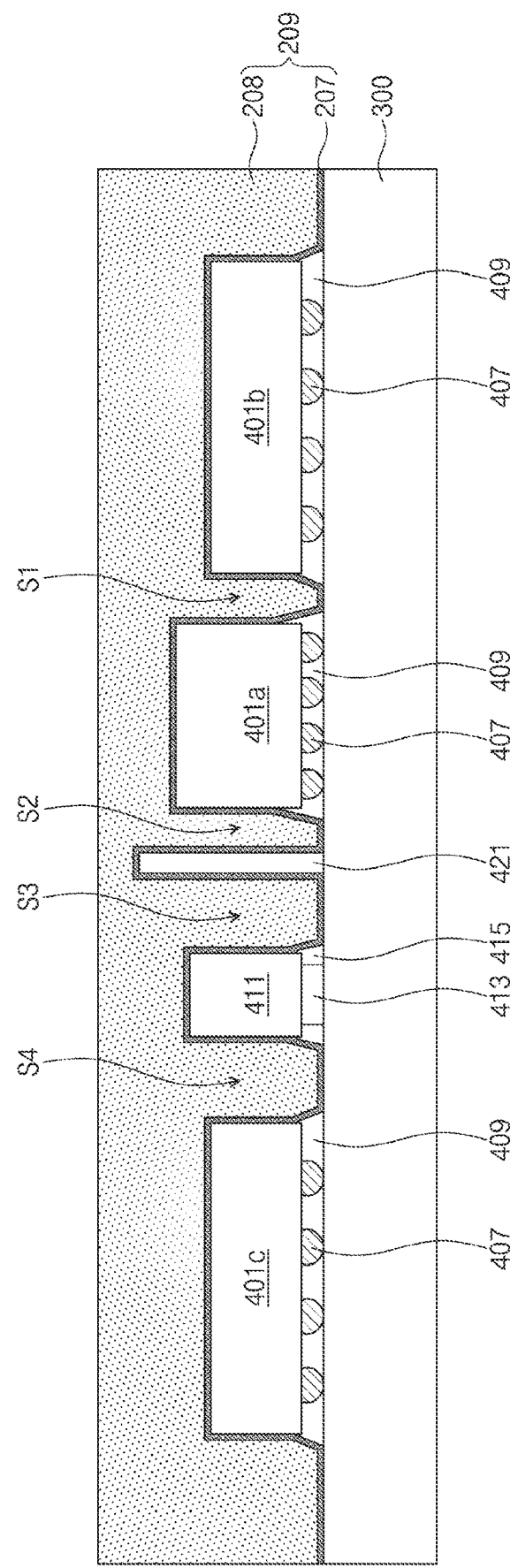
Figure 4C:
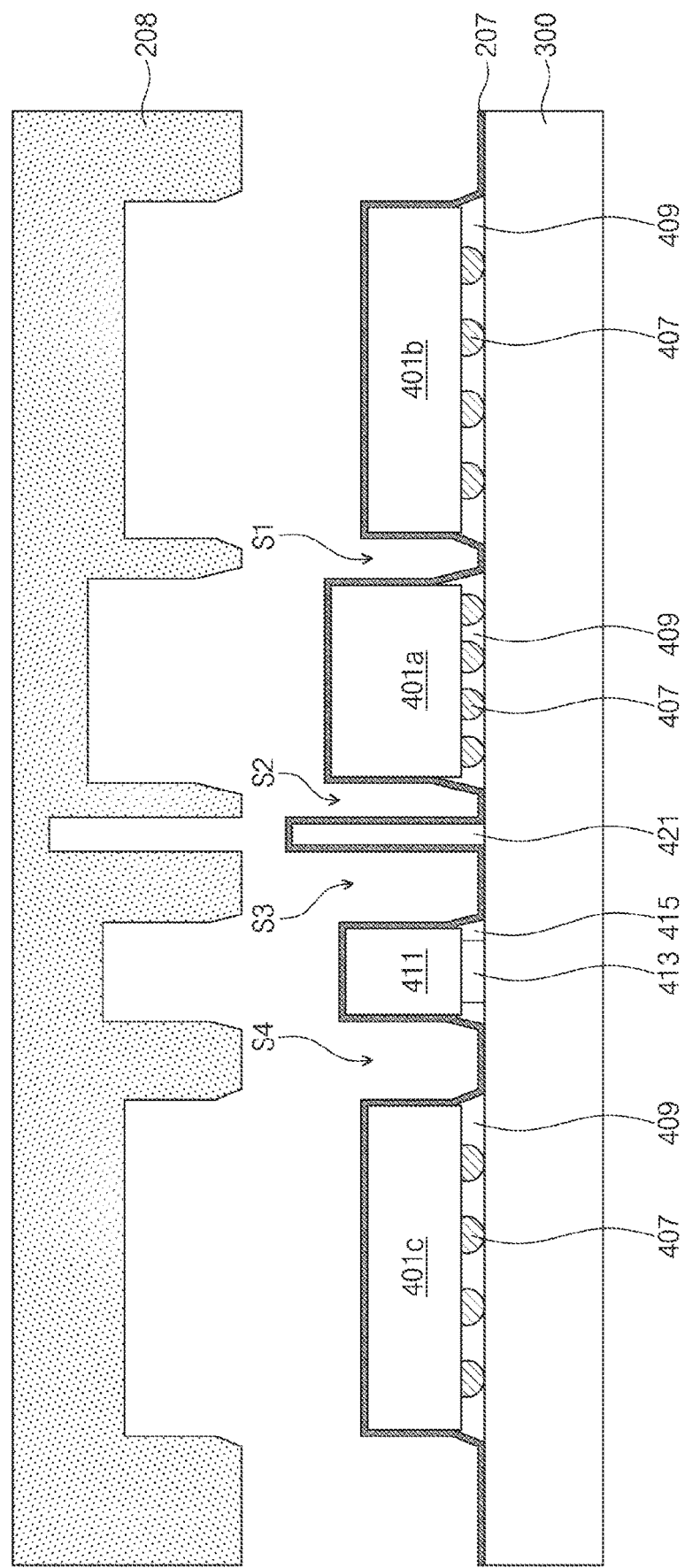

FIGS. 4A, 4B and 4C illustrate cross-sectional views showing a method of fabricating a semiconductor module according to one or more example embodiments. For conciseness, constituents substantially the same as those discussed with reference to FIGS. 3A to 3E are allocated the same reference numerals, and a repetitive explanation thereof will be omitted.

Referring to FIG. 4A, a component 411 and first, second and third semiconductor chips 401a, 401b, and 401c may be provided on a module substrate 300. The module substrate 300 may be a printed circuit board (PCB) with a circuit pattern. The providing of the first, second and third semiconductor chips 401a, 401b and 401c on the module substrate 300 may include a soldering process to form solder balls 407 on active surfaces of the first, second and third semiconductor chips 401a, 401b and 401c, allowing the module substrate 300 to be attached with the first, second and third semiconductor chips 401a, 401b and 401c on which the solder balls 407 are formed, and forming first under-fill resin layers 409 in spaces among the module substrate 300 and the first, second and third semiconductor chips 401a, 401b and 401c. The first, second and third semiconductor chips 401a, 401b and 401c may have different heights from each other. Each of the first, second and third semiconductor chips 401a, 401b and 401c may be a semiconductor logic chip or a semiconductor memory chip. The first under-fill resin layers 409 may be formed of, for example, an under-fill material.

The providing of the component 411 on the module substrate 300 may include providing the module substrate 300 with an adhesive layer 413 formed on a surface of the component 411 and forming in a space, between the component 411 and the module substrate 300, a second under-fill resin layer 415 to surround the adhesive layer 413. Alternatively, the component 411 may be soldered onto the module substrate 300. The component 411 may have a different height from those of the first, second and third semiconductor chips 401a, 401b and 401c. The component 411 may be replaced with a resistor, an inductor, a transformer, a passive device, or other electric devices. The second under-fill resin layer 415 may be formed of, for example, an under-fill material.

A partition wall 421 may be formed on the module substrate 300. For example, the partition wall 421 may be disposed on the module substrate 300 between the first semiconductor chip 401a and the third semiconductor chip 401c. The partition wall 421 may separate the component 411 from other components (not shown). For example, the partition wall 421 may be formed by stamp, forging, metal injection molding, machining, micro-machining, or other techniques. As another example, the partition wall 421 may be formed of a conductive adhesive. The partition wall 421 may be formed of, for example, a conductive material such as aluminum, iron, or copper.

A conductive adhesion film 209 may be disposed on the first, second and third semiconductor chips 401a, 401b and 401c, the component 411, the partition wall 421, and a top surface of the module substrate 300. The conductive adhesion film 209 may include a functional layer 207 and a cushion layer 208 stacked on the functional layer 207.

Referring to FIG. 4B, the conductive adhesion film 209 may be processed to cover the first, second and third semiconductor chips 401a, 401b and 401c, the component 411, the partition wall 421, the first under-fill resin layers 409, and the second under-fill resin layer 415, and also to fill first, second, third and fourth spaces S1, S2, S3, and S4.

For example, the functional layer 207 may conformally cover top and side surfaces of the first, second and third semiconductor chips 401a, 401b and 401c, top and side surfaces of the partition wall 421, surfaces of the first under-fill resin layers 409, and a surface of the second under-fill resin layer 415. The functional layer 207 may also cover a top surface of the module substrate 300 exposed to the first space S1 between the first semiconductor chip 401*a* and the second semiconductor chip 401*b*, a top surface of the module substrate 300 exposed to the second space S2 between the first semiconductor chip 401*a* and the partition wall 421, a top surface of the module substrate 300 exposed to the third space S3 exposed to the component 411 and the partition wall 421, and a top surface of the module substrate 300 exposed to the fourth space S4 between the third semiconductor chip 401*c* and the component 411. The cushion layer 208 may cover the functional layer 207 and fill the first, second, third and fourth spaces S1, S2, S3 and S4.

A press process may be performed to cause the conductive adhesion film 209 to cover the first, second and third semiconductor chips 401*a*, 401*b* and 401*c*, the component 411, and the partition wall 421, and also to fill the first, second, third and fourth spaces S1, S2, S3 and S4. Each of the first, second, third and fourth spaces S1, S2, S3 and S4 may have an aspect ratio equal to or less than about 5.

Referring to FIG. 4C, the cushion layer 208 may be removed from the functional layer 207. The functional layer 207 may remain on the surfaces of the first, second and third semiconductor chips 401*a*, 401*b* and 401*c*, the surface of the component 411, the surfaces of the first under-fill resin layers 409, the surface of the second under-fill resin layer 415, and the top surface of the module substrate 300 exposed to the first, second, third and fourth spaces S1, S2, S3 and S4.

According to some example embodiments, the functional layer 207 may be formed to conformally cover the surfaces of the first, second and third semiconductor chips 401*a*, 401*b* and 401*c* having different heights from each other on the module substrate 300, the surface of the component 411, and the surface of the partition wall 421, and at the same time, to conformally cover floor surfaces of the spaces S1 to S4 having high aspect ratios among the first, second and third semiconductor chips 401*a*, 401*b* and 401*c*, the component 411, and the partition wall 421, which may result in a reduced process time.

Referring back to FIG. 2, a molding layer 437 may be formed on the functional layer 207. The molding layer 437 may cover the functional layer 207 and fill the first, second, third and fourth spaces S1, S2, S3 and S4. The molding layer 437 may be formed of, for example, an epoxy molding compound (EMC) or an under-fill material.

According to some example embodiments, since a functional layer is formed to conformally cover top surfaces of molding layers encapsulating semiconductor chips disposed on a package substrate, and at the same time, to conformally cover floor and side surfaces of a groove having a high aspect ratio between the molding layers, the formation of the functional layer 207 may be performed prior to a package singulation process (sawing or sorting). Therefore, less time may be required to form the functional layer that shields electromagnetic waves or radiates heat.

According to other example embodiments, a functional layer may be formed to conformally cover surfaces of a component and semiconductor chips having different heights from each other, and at the same time, to conformally cover a top surface of a module substrate exposed to spaces between the component and the first, second and third semiconductor chips. Therefore, less time may be required to form the functional layer that shields electromagnetic waves or radiates heat.

Although example embodiments have been described, it will be understood to those skilled in the art that various changes and modifications may be made without departing from the technical spirit and essential feature of the present disclosure. It will be apparent to those skilled in the art that various substitution, modifications, and changes may be thereto without departing from the scope and spirit of the present disclosure.

What is claimed is:

1. A semiconductor package, comprising:
a package substrate comprising a ground layer;
a semiconductor chip disposed on the package substrate;
a molding layer covering the semiconductor chip and a first region of the package substrate; and
a functional layer covering the molding layer and extending onto a second region of the package substrate that surrounds the first region,
wherein a side surface of the ground layer is exposed.

2. The semiconductor package of claim 1, wherein a second region face of the second region of the package substrate is located at a level lower than that of a first region face of the first region of the package substrate.

3. The semiconductor package of claim 2, wherein the molding layer is aligned with a side surface of the first region of the package substrate.

4. The semiconductor package of claim 2, wherein a first region side surface of the first region of the package substrate is covered by the functional layer.

5. The semiconductor package of claim 1, wherein the functional layer covering the molding layer and the functional layer covering a second region face of the second region of the package substrate have a same thickness.

6. The semiconductor package of claim 1, wherein a side surface of the second region of the package substrate, which includes the side surface of the ground layer, is exposed.

7. The semiconductor package of claim 1, wherein the functional layer comprises a conductive material and a polymeric material,
wherein the conductive material is one from among copper (Cu), silver (Ag), and aluminum (Al), and
wherein the polymeric material is epoxy or thermoplastic polyurethane (TPU).

8. The semiconductor package of claim 1, wherein the functional layer is an electromagnetic shield layer or a thermal radiation layer.

9. A semiconductor package, comprising:
a package substrate;
a semiconductor chip disposed on the package substrate;
a molding layer covering the semiconductor chip and a first region of the package substrate; and
a functional layer covering the molding layer and extending onto a second region of the package substrate that surrounds the first region,
wherein the package substrate further comprises a ground layer,
wherein the ground layer is interposed between layers of the package substrate in the first region, and
wherein the ground layer is interposed between the functional layer and the package substrate in the second region.

10. A semiconductor module, comprising:
a module substrate;
a first semiconductor chip disposed on the module substrate and having a first height;
a second semiconductor chip disposed on the module substrate and having a second height different from the first height; and a functional layer covering the first semiconductor chip, the second semiconductor chip and extending onto a top surface of the module substrate between the first semiconductor chip and the second semiconductor chip, wherein the functional layer covering the first semiconductor chip is disposed at a third height and the functional layer covering the second semiconductor chip is disposed at a fourth height different from the third height.

11. The semiconductor module of claim 10, wherein a first space is interposed between the first semiconductor chip and the second semiconductor chip, and wherein the first space has an aspect ratio equal to or less than 5.

12. The semiconductor module of claim 10, wherein the functional layer covering the first semiconductor chip and the second semiconductor chip and the functional layer covering the top surface of the module substrate have a same thickness.

13. The semiconductor module of claim 10, further comprising a component disposed on the module substrate, wherein the component is covered by the functional layer, which extends onto the top surface of the module substrate between the component and the first semiconductor chip.

14. The semiconductor module of claim 10, further comprising a partition wall disposed on the module substrate, wherein the partition wall is conformally covered by the functional layer.

15. The semiconductor module of claim 14, wherein the partition wall comprises a conductive material.

16. The semiconductor module of claim 10, wherein the functional layer comprises a conductive material and a polymeric material, wherein the conductive material is one from among copper (Cu), silver (Ag), and aluminum (Al), and wherein the polymeric material is epoxy or thermoplastic polyurethane (TPU).

17. The semiconductor module of claim 10, wherein the functional layer is an electromagnetic shield layer or a thermal radiation layer.

18. The semiconductor module of claim 10, further comprising:

solder balls interposed between each of the first semiconductor chip, the second semiconductor chip and the module substrate; and an under-fill resin layer disposed in a gap between each of the first semiconductor chip, the second semiconductor chip and the module substrate.

19. The semiconductor module of claim 10, further comprising a molding layer covering the functional layer and filling a first space that is interposed between the first semiconductor chip and the second semiconductor chip.

* * * * *